(12) United States Patent
Philipp et al.

(10) Patent No.: US 8,552,995 B2
(45) Date of Patent: Oct. 8, 2013

(54) SENSOR AND METHOD OF SENSING

(75) Inventors: Harald Philipp, Hamble (GB); Esat Yilmaz, Chandler's Ford (GB)

(73) Assignee: Atmel Corporation, San Jose, CA (US)

( * ) Notice: Subject to any disclaimer, the term of this patent is extended or adjusted under 35 U.S.C. 154(b) by 860 days.

(21) Appl. No.: 12/604,258

(22) Filed: Oct. 22, 2009

(65) Prior Publication Data

US 2010/0097077 A1 Apr. 22, 2010

Related U.S. Application Data

(60) Provisional application No. 61/107,419, filed on Oct. 22, 2008.

(51) Int. Cl.
*G06F 3/041* (2006.01)

(52) U.S. Cl.
USPC ..... 345/173; 345/174; 178/18.01; 178/18.05; 178/18.06; 178/18.07

(58) Field of Classification Search
USPC .......... 345/173–175; 178/18.01, 18.05–18.07
See application file for complete search history.

(56) References Cited

U.S. PATENT DOCUMENTS

| | | | |
|---|---|---|---|
| 5,933,102 A * | 8/1999 | Miller et al. | 324/678 |
| 6,452,514 B1 | 9/2002 | Philipp | |
| 6,466,036 B1 | 10/2002 | Philipp | |
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2006/0279395 A1 | 12/2006 | Lee et al. | |
| 2008/0036473 A1 | 2/2008 | Jansson | |

(Continued)

FOREIGN PATENT DOCUMENTS

| | | |
|---|---|---|
| WO | WO-9723738 A1 | 3/1997 |
| WO | WO-9938149 A1 | 7/1999 |
| WO | WO-0044018 A1 | 7/2000 |
| WO | WO 2012/129247 | 9/2012 |

OTHER PUBLICATIONS

"International Application Serial No. PCT/US2009/061718, Search Report mailed Jan. 19, 2010", 3 pgs.

(Continued)

*Primary Examiner* — Lun-Yi Lao
*Assistant Examiner* — Peter D McLoone
(74) *Attorney, Agent, or Firm* — Baker Botts LLP

(57) ABSTRACT

A touch sensor senses the presence of an object at one of a plurality of channels on a surface of the touch sensor, wherein proximity of the object to the touch sensor results in a change in capacitance at the position of the channel. The touch sensor includes a drive circuit and a charge sensing circuit, each coupled to each of the channels. The charge sensing circuit includes at least one charge measurement capacitor. A measurement cycle is applied to the touch sensor having a drive portion and a sense portion. During the drive portion a charge is applied to the channels and therefore the charge measurement capacitors of the touch sensor, and during a sense portion the charge measurement capacitors are discharged by a predetermined amount and the remaining charge on the charge measurement capacitors is measured.

20 Claims, 11 Drawing Sheets

(56) References Cited

U.S. PATENT DOCUMENTS

| | | |
|---|---|---|
| 2009/0243632 A1 | 10/2009 | Ozawa |
| 2009/0315854 A1 | 12/2009 | Matsuo |
| 2012/0242588 A1 | 9/2012 | Myers |
| 2012/0242592 A1 | 9/2012 | Rothkopf |
| 2012/0243151 A1 | 9/2012 | Lynch |
| 2012/0243719 A1 | 9/2012 | Franklin |

OTHER PUBLICATIONS

"International Application Serial No. PCt/US2009/061718, Written Opinion mailed Jan. 19, 2010", 6 pgs.

U.S. Appl. No. 61/454,936, filed Mar. 21, 2011, Myers.

U.S. Appl. No. 61/454,950, filed Mar. 21, 2011, Lynch.

U.S. Appl. No. 61/454,894, filed Mar. 21, 2011, Rothkopf.

* cited by examiner

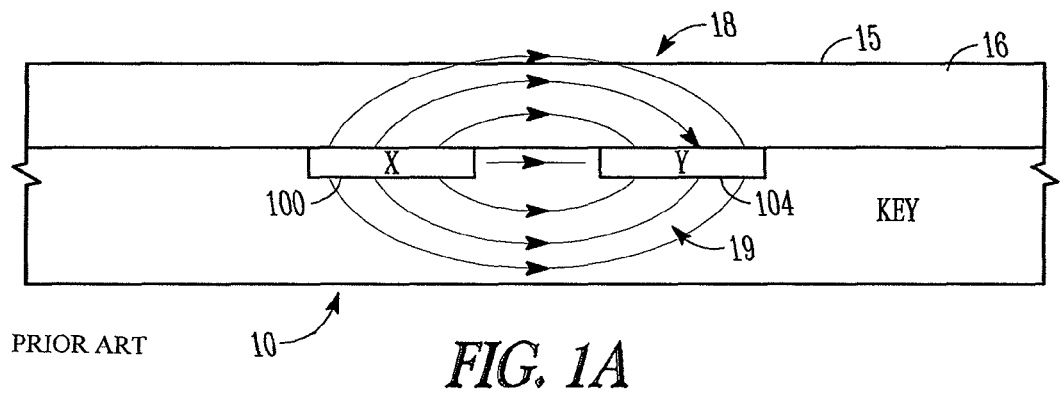
PRIOR ART *FIG. 1A*
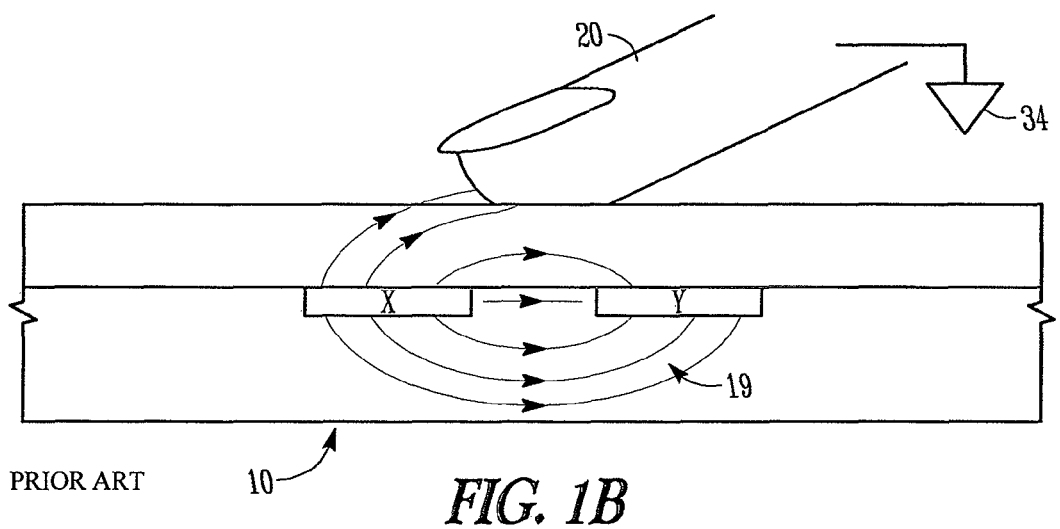
PRIOR ART *FIG. 1B*
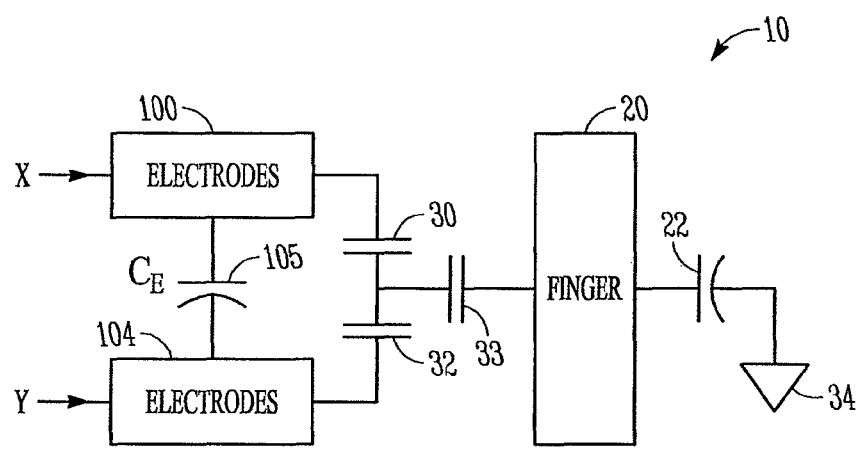
PRIOR ART *FIG. 2*

SENSOR AND METHOD OF SENSING

RELATED APPLICATIONS

This application claims the benefit under 35 U.S.C. 119(e) of U.S. Provisional Patent Application Ser. No. 61/107,419, filed on Oct. 22, 2008, which is incorporated herein by reference in its entirety.

BACKGROUND

There are various forms of touch sensitive controls which use a capacitive sensor to sense the presence of a body such as a user's finger at a plurality of positions on the sensor. A touch sensitive capacitive sensor for example is disclosed in WO-97/23738. The capacitive sensing device disclosed in WO-97/23738 relies on measuring the capacitance of a sensing electrode to a system reference potential (earth). A single coupling plate is provided and disposed to form a touch sensitive switch. The coupling plate is referred to as a key. In accordance with this example, the key is charged using a drive circuit for a drive part of a measurement cycle and then this charge is measured by transferring the induced charge from the key to a charge measurement capacitor of a charge detection circuit during a measurement part of the cycle. Typically, a burst of measurement cycles are performed, before measuring the charge present on the charge measurement capacitor. The sensor can detect the presence of an object near the key as a result of a change in an amount of the charge induced onto the key. Effectively, this provides a measure of a change in capacitance of the key as a result of the presence of the body or object. When a pointing object for example a user's finger approaches the sensing electrode (Y plate), the pointing object appears to be a virtual ground. This serves to change the measured capacitance of the sensing electrode to ground. Thus, the change in measured capacitance is taken to indicate the presence of a pointing object. Thus, by providing a plurality of sensing electrodes, or keys, a plurality of positions on the touch sensor may be detected.

Another form of touch sensitive control is disclosed in U.S. Pat. No. 6,452,514. In this example a pair of electrodes is provided which act as a key so that the presence of a body, such as a user's finger, is detected as a result of a change in an amount of charge which is transferred between the two electrodes. With this arrangement, one of the electrodes (labeled X) is driven with a drive circuit and the other of the pair of electrodes (labeled Y) is connected to a charge sensing circuit which detects an amount of charge present on the Y plate when driven by the X plate. As disclosed in WO-OO/4400 18 several pairs of electrodes can be arranged to form a matrix of sensing areas which can provide an efficient implementation of a touch sensitive two-dimensional position sensor.

In some examples, a plurality of keys can be disposed to form a two dimensional touch sensor. Two dimensional touch sensors are typically used with devices which include touch sensitive screens or touch sensitive keyboards/keypads which are used in, for example, consumer electronic devices and domestic appliances. The two dimensional touch sensors can also be used in conjunction with an underlying display such as a Liquid Crystal Display (LCD) or a Cathode Ray Tube (CRT), to form a touch sensitive display screen. Such touch sensitive display screens have become increasingly popular and common not only in conjunction with personal computers but also in all manner of other appliances such as Personal Digital Assistants (PDAs), Point Of Sale (POS) terminals, electronic information and ticketing kiosks, kitchen appliances and the like. It is generally desirable to provide improvements in a process for detecting a body with a touch sensor employing a plurality of keys.

SUMMARY

According to some embodiments a touch sensor for sensing the presence of a body at one of a plurality of positions on a surface of the touch sensor, each position having a channel corresponding to an intersection of a drive and a sense electrode, the presence of the body being determined as a result of a change in capacitance of the channel. The touch sensor comprises a drive circuit coupled to each of the channels, and for each of the channels, a charge sensing circuit, each of the charge sensing circuits including a charge measurement capacitor. A controller is arranged in operation to control the drive circuit to induce charge onto each of the channels during a drive part of a measurement cycle, and to control each of the charge sensing circuits to couple the charge measurement capacitor respectively to the corresponding channel during a charge measurement part of the measurement cycle to the effect that the charge induced on the channel during the drive part of the measurement cycle is transferred to each of the respective charge measurement capacitors. The controller is arranged to control each of the charge sensing circuits to determine an amount of charge present on each of the charge measurement capacitors. of the charge sensing circuits in sequence, by discharging the charge measurement capacitors. The controller is arranged to discharge the charge measurement capacitor of each of the charge sensing circuits contemporaneously by a predetermined amount, before an amount of charge remaining on each of the charge measurement capacitors is determined in sequence to identify whether there has been a change in the capacitance of the channel as a result of the presence of the body.

According to some embodiments a touch sensor which includes a plurality of channels which may be driven, for example, by a common drive circuit and the charge induced on the channels is transferred to one of a corresponding plurality of charge measurement capacitors. In operation, each of the charge measurement capacitors is discharged in sequence, to measure the amount of charge induced on the channels, so that the presence of a body can be detected proximate one of the channels as a result of a change in capacitance of the channel. Each of the charge measurement capacitors is discharged in sequence, one after the other, so that, for example, a comparator to ground or a single, analog to digital converter and a single interface to the controller can be used to measure the capacitance of each of the channels to reduce costs.

According to some embodiments, before the charge present on each of the charge measurement capacitors is determined, each of the charge measurement capacitors is discharged through for example a fixed resistance Surface Mount Power (SMP) resistor by a predetermined amount, which is less than an expected total charge present, in parallel. In various embodiments, the charge measurement capacitors are contemporaneously discharged by a predetermined amount, although the amount of charge remaining still provides enough charge to detect the presence of the body. As a result, a time taken to generate charge measurements for each of the charge measurement capacitors is proportionally reduced from that which would be required if each of the charge measurement capacitors were discharged for the total amount of charge accumulated from the channels.

In some examples, the predetermined amount by which each of the charge measurement capacitors is contemporaneously discharged, before the amount of charge remaining is determined, is set in accordance with an expected amount of charge present on each of the charge measurement capacitors as a result of the presence of a body proximate to a corresponding one of the channels of the touch sensor. The predetermined amount may be pre-set in the controller or generated from measurements of a range of possible charge values on the charge measurement capacitors for the presence or absence of a body, which are taken during an initialization phase. The range of possible charge values is used to determine an amount of charge which should remain, and therefore correspondingly the amount by which each charge measurement capacitor can be discharged.

Although in some examples, the plurality of channels are driven by a single drive circuit and the plurality of charge sensing circuits are arranged to determine the charge induced on the channels, in other examples a plurality of drive circuits are provided, each of which is coupled to a plurality of the channels via common driving lines and each of the charge sensing circuits is coupled to a different plurality of channels via common receiving lines. As such, the channels can be disposed on a two dimensional surface to form a two dimensional touch sensor. Alternatively, the single drive circuit example, could be used to form a linear sensor or control, for determining the presence of a body at a plurality of positions along the linear sensor.

In some examples a matrix of channels is formed, with each channel being formed from a drive plate and a receiving plate. In other examples, each of the channels is formed from a coupling plate, which is first driven by a drive circuit to induce charge and then the induced charge is transferred to a charge measurement capacitor.

Thus, one embodiment provides an apparatus for sensing the presence of a body at one of a plurality of positions on a surface of a touch sensor, where each position has a channel and where the presence of the body is determined as a result of a change in capacitance of the channel. This apparatus includes a controller for controlling a drive circuit, controlling a charge sensing circuit for each channel to couple a charge measurement capacitor respectively to the channel during a charge measurement part of the measurement cycle to the effect that the charge induced on the channel during the drive part of the measurement cycle is transferred to each of the respective charge measurement capacitors of the charge sensing circuits, and determining an amount of charge present on each of the charge measurement capacitors of the charge sensing circuits in sequence, by discharging the charge measurement capacitors in sequence, wherein the controller for determining the amount of charge present on each of the charge measurement capacitors is further for discharging contemporaneously the charge measurement capacitor of each of the charge sensing circuits by a predetermined amount before determining an amount of charge remaining on each of the charge measurement capacitors in sequence to identify whether there has been a change in the capacitance of the channel as a result of the presence of the body.

Various further aspects and features of example embodiments are defined in the appended claims, which include a method of sensing the presence of a body at one of a plurality of positions on a surface of a touch sensor and a touch sensitive control panel including a channel matrix.

BRIEF DESCRIPTION OF THE DRAWINGS

FIG. 1A is a schematic block diagram providing an example of a touch sensitive sensor;

FIG. 1B is an example illustration of a user's finger disposed proximate the sensor;

FIG. 2 is a schematic block diagram illustrating an electrical equivalent of the touch sensor shown in FIG. 1B;

DETAILED DESCRIPTION

Figure 3:
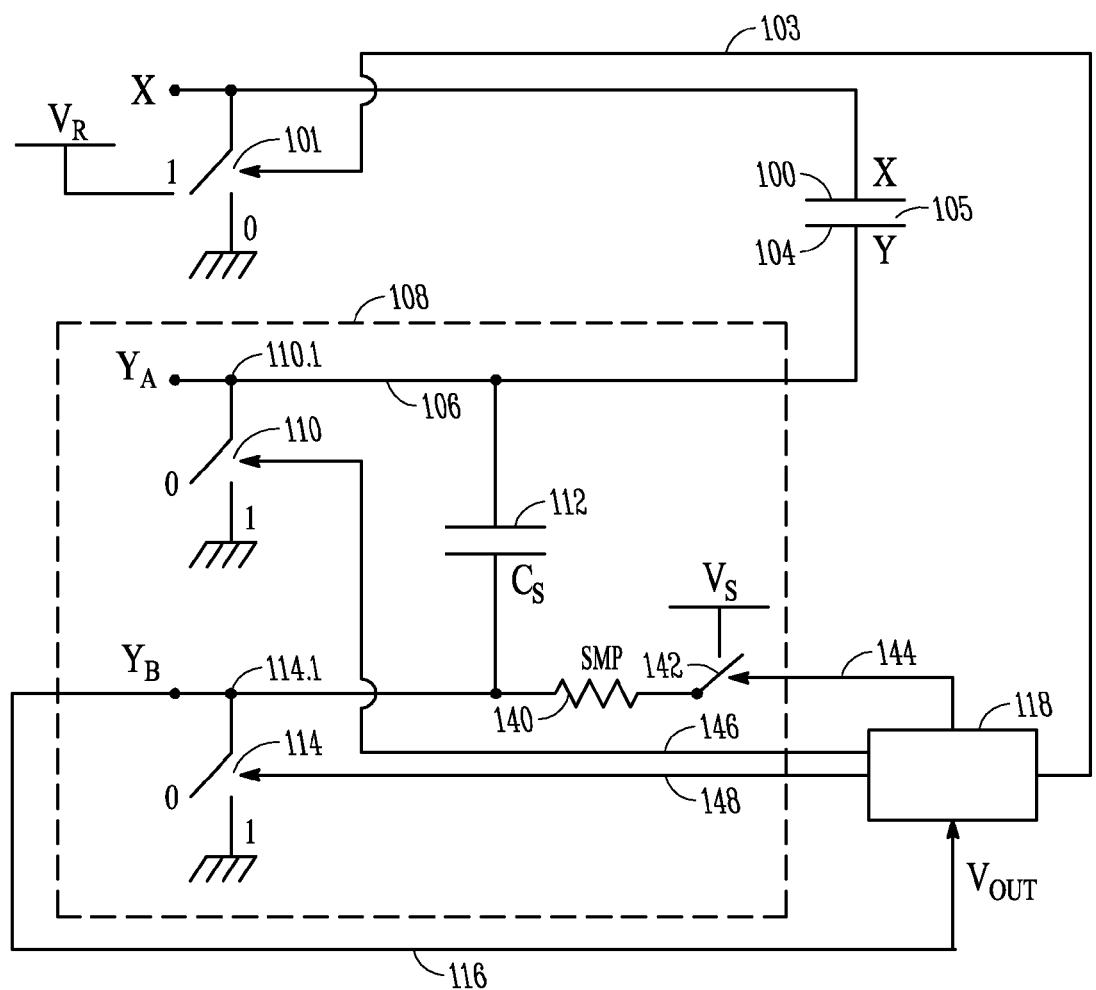
FIG. 3 is a schematic block diagram of a circuit which in combination with the touch sensor shown in FIG. 1B serves to form a touch sensor.

As explained above, there are various forms of touch sensors which can determine the presence of a body proximate a sensing element of the touch sensor as a result of a change of charge transferred from a channel of the touch sensor. An example of such a touch sensor is shown in FIGS. 1A and 1B. The example shown in FIGS. 1A and 1B correspond to an example in which a pair of transverse electrodes forms a touch sensor. As shown in FIG. 1A a pair of electrodes 100, 104 which form a drive or X plate and a receiving or Y plate, and are disposed beneath the surface of a touch sensitive control panel 15. The electrodes 100, 104 are disposed beneath a dielectric layer 16, for example a glass or plastic panel. As shown in FIGS. 1A and 1B the touch sensor 10 is arranged to detect the presence of a body, such as a user's finger 20, as a result of a change in an amount of charge received by the Y plate 104. As shown in FIG. 1A when the X plate 100 is charged or driven by a circuit, an electric field is formed which is illustrated by the lines 18 and 19 both above and below the touch panel surface 15 as a result of which charge is transferred to the Y plate 104. The X plate and the Y plate 100, 104 form a capacitively charged channel 10. As shown in FIG. 1B as a result of the disturbance of the electric field 18 due to the presence of the user's finger 20, the electric field of the control panel 15 is disturbed as a result of an earthing or grounding effect provided by the user's finger 20 as illustrated schematically by ground 34.

An equivalent circuit diagram of the touch sensor 10 shown in FIGS. 1A and 1B is shown in FIG. 2. In FIG. 2, equivalent capacitances are illustrated in the form of a circuit diagram. A capacitance formed between the X plate 100 and the Y plate 104 of the channel is a capacitance CE 105. The presence of the body 20 has an effect of introducing shunting capacitances 30, 32, 33 which are then grounded via the body 20 by an equivalent grounding capacitor 22 to the ground 34. Thus the presence of the body 20 affects the amount of charge transferred to the Y plate of the channel and therefore provides a way of detecting the presence of the body 20. This is because the capacitance between the X plate 100 and the Y plate 104 of the channel CE 105 reduces as the grounding capacitances 22, 30, 32, 33 increases.

FIG. 3 provides an example circuit diagram, which forms a touch sensor by sensing an amount of charge transferred from the X plate 100 shown in FIG. 2 to the Y plate 104 and includes a charge measurement circuit, similar to that described in U.S. Pat. No. 6,452,514.

As shown in FIG. 3, a drive circuit 101 is connected to the X plate 100 of the channel and the Y plate 104 of the channel is connected to an input 106 of a charge measurement circuit 108, wherein the X and Y plates collectively form the capacitor 105. The input 106 is connected to a first controllable switch 110 and to one side of a charge measurement capacitor Cs 112. The other side of the measurement capacitor 112 is connected via a second switch 114 to an output 116 of the charge measurement circuit 108, which is fed as a voltage $V_{OUT}$ to a controller 118. A first input control channel 103 is used to control the operation of the drive circuit 101.

The controller 118 also outputs control line 146 to control switch 110, and control line 148 to control switch 114. In the circuit diagram shown in FIG. 3, a convention has been adopted to show that a control input of each of the switches 110, 114 is open for the control input "0" and closed for the control input "1." The other side of each of the switches 110, 114 is connected to ground, so that if the control input is "1" then the connecting input would be connected to ground. A similar convention has been adopted for drive circuit 101, whereby when the control input 103 is "0" the X plate is connected to ground, and when the control input is "1" the X plate is connected to a reference voltage "$V_R$." The operation of the touch sensor illustrated in FIG. 3, including the function of the charge measurement circuit which is arranged to measure an amount of charge transferred from the X plate 100 to the Y plate 104 of the channel 105, is explained with reference to the timing diagram illustrated in FIG. 4.

Figure 4:
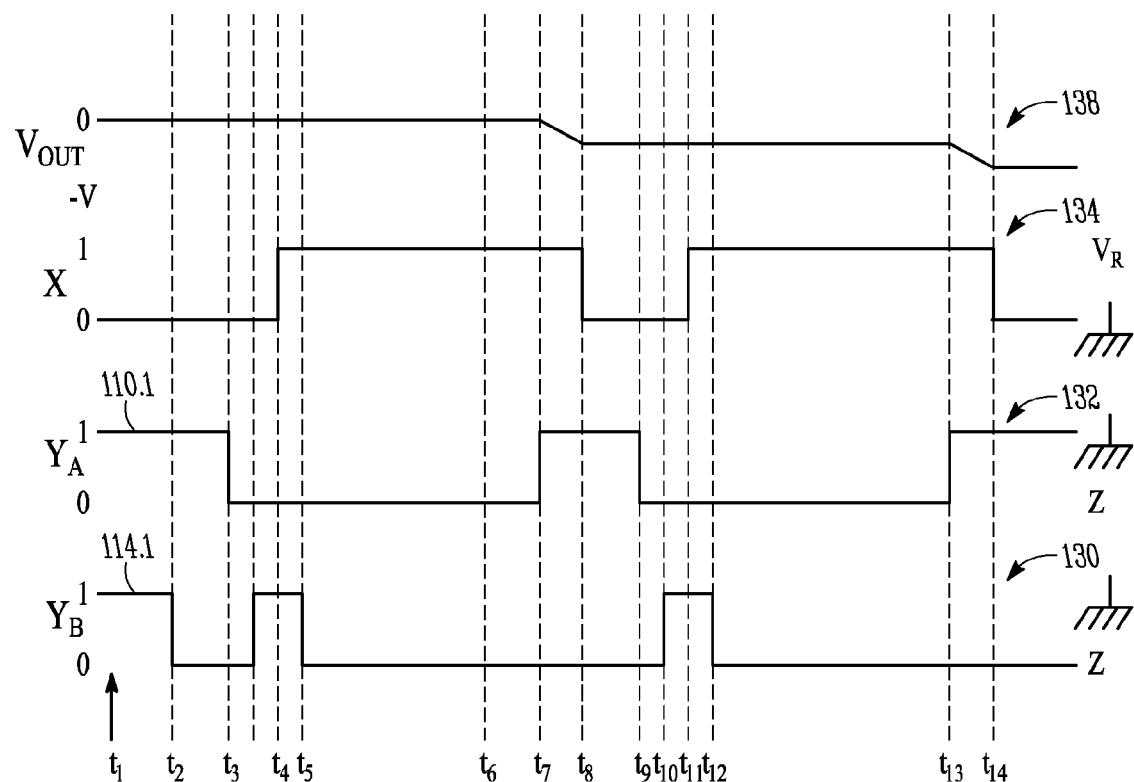
FIG. 4 is an example timing diagram illustrating the operation of the sensing circuit shown in FIG. 3.

In FIG. 4, four timing diagrams 130, 132, 134, 138 illustrate the operation of the charge measurement circuit 108 of FIG. 3. A first timing diagram 130 represents the control input 148 from the controller 118 applied to the second switch 114. The left hand axis represents the logical value of the control inputs on control lines 103, 146, and 148. On the right hand axis the effect at the connecting point 114.1 is shown to be either "Z" in which the connecting point 114.1 is isolated or floating, or for a logical control input of 1 grounded. Similarly a timing diagram 132 illustrates for logical control input values "0" or "1" of a connecting point 110.1 at either floating (Z) or ground (0). A third timing diagram 134 illustrates a relative timing of a drive signal provided to the X plate 100 of the channel in which case, in contrast to the timing diagrams 130, 132 for the two switches 110, 114, the value of the timing diagram 134 is an absolute value so that the left hand side illustrates that the voltage applied to the X plate 100 varies between 0V and the reference voltage $V_R$, which is the reference voltage used to charge the X plate 100. The final timing diagram 138 provides an illustration of the example signal strength or voltage produced on the measurement capacitor 112 as a result of the opening and closing of the switches 110, 114 and the driving of the X plate 100 in accordance with the timing illustrated by the timing diagrams 130, 132, 134.

The timing diagrams 130, 132, 134, 138 are explained, wherein in FIG. 4, at a first time point $t_1$, the charge measurement circuit 108 is initialized with both the control input lines 146, 148 for the switches 110, 114 being high (1) and the control input line 103 for the drive circuit 101 being low (0). Control input lines 146, 148 and 103 are lines connected to the controller 118. Thus, the Y plate 104, the charge measurement capacitor 112, and the X plate 100 of the channel 105 are set to ground. Correspondingly, the output voltage across the charge measurement circuit 112 is at zero Volts. At time point $t_2$ the logical input on control input line 148 to the control switch 114 is set low (0) to zero thereby opening the switch 114 and floating the connecting point 114.1, which connects the output voltage at connection point 114.1, referred to as $Y_B$, as an output voltage, $V_{out}$, to controller 118 on line 116. The line 116 effectively couples one side of the measurement capacitor 112 to the controller 118. At a next time, $t_3$, the control input on control line 146 to the switch 110 is set low (0) thereby opening the switch 110 and floating the connecting point 110.1, which is $Y_A$, before at a time point, $t_4$, the control line 103 to the drive circuit 101 drives the X plate 100 of the channel 105 to the reference voltage $V_R$. Then in order to charge the measurement capacitor Cs for a period S between times $t_5$ and $t_6$, the control input to the switch 114 is set high (1) thereby grounding $Y_B$ to transfer charge on the Y plate 104 of the channel 105 to the charge measurement capacitor 112, until time $t_6$ when the control input to the switch 114 is set to low (0), which again floats the connecting point 114.1. After charging the measurement capacitor Cs for a first dwell time between time points $t_5$ and $t_6$, at time point $t_7$ the control input to switch 110 on the control line 146 is set high (1), thereby grounding the connecting point 110.1, which is connected to one side of the charge measurement capacitor Cs 112. As a result, the voltage across the charge measurement capacitor 112 may be measured. The amount of charge from the Y plate 104 seen on the charge measurement capacitor Cs 112 during the dwell time between time points $t_5$ and $t_6$ is represented as the output voltage $V_{OUT}$.

At time $t_8$ the control input on control line 103 to the drive circuit 101 goes low (0), thereby connecting the X plate 100 of the channel 105 is connected to ground which concludes a first measurement cycle. At time point $t_9$ the next measurement cycle of the measurement burst occurs. At time point $t_9$ the control input on the control line 146 to the switch 110 goes low (0), thereby floating $Y_A$. The control input on control line 103 to the drive circuit 101 again goes high (1), thereby connecting the X plate 100 to the reference voltage $V_R$, at time point $t_{10}$. The charge measurement capacitor 112 is again charged from charge transferred from the Y plate 104 of the channel 105 onto the charge measurement capacitor 112. As with the first burst, at time point $t_{11}$ the control input on control line 148 to the switch 114 goes high (1), thereby grounding the connecting point 114.1 and driving charge onto the charge measurement capacitor until time point $t_{12}$, when the control input on control line 148 to the switch 114 goes low (0) again floating $Y_B$. Thus again charge is transferred from the Y plate 104 during the dwell period between times $t_{11}$ and $t_{12}$, thereby increasing the voltage across the charge measurement capacitor Cs. The voltage across the charge measurement capacitor 112 is represented as the output voltage $V_{OUT}$ with respect to connecting point 110.1, which is coupled to ground. At time $t_{13}$ the control input on control line 146 to the switch 110 is set high (1), thereby grounding $Y_A$ and at time $t_{14}$ control input 103 to the drive circuit 101 goes low (0), thereby connecting the X plate 100 of the channel 105 to ground, which concludes the second measurement cycle. Thus, as with the first measurement cycle an amount of charge has been transferred from the Y plate 104, which has then increased the voltage across the charge measurement capacitor 112, which represents an amount of charge transferred from the Y plate 104.

After one or more measurement cycles of the burst, the amount of charge on the charge measurement capacitor 112 may be determined with the aid of a discharge resistor 140. One side of the discharge resistor 140 is connected to the measurement capacitor and the other side SMP is connected to a discharge switch 142. The discharge switch 142 receives a control signal from the controller 118 via a control line 144. The controller 118 is controlled so as to float SMP the discharge resistor 140 during measurement cycles and to discharge the charge measurement capacitor Cs 112 through the discharge resistor 140 by connection to a voltage $V_S$. The controller 118 then determines an amount of charge present on the charge measurement capacitor 112 by counting a number of clock periods until the charge on the charge measurement capacitor Cs 112 is discharged to zero. The number of clock periods therefore provides a relative signal sample value for the respective measured charge signal.

Two Dimensional Touch Sensor Example

Figure 5:
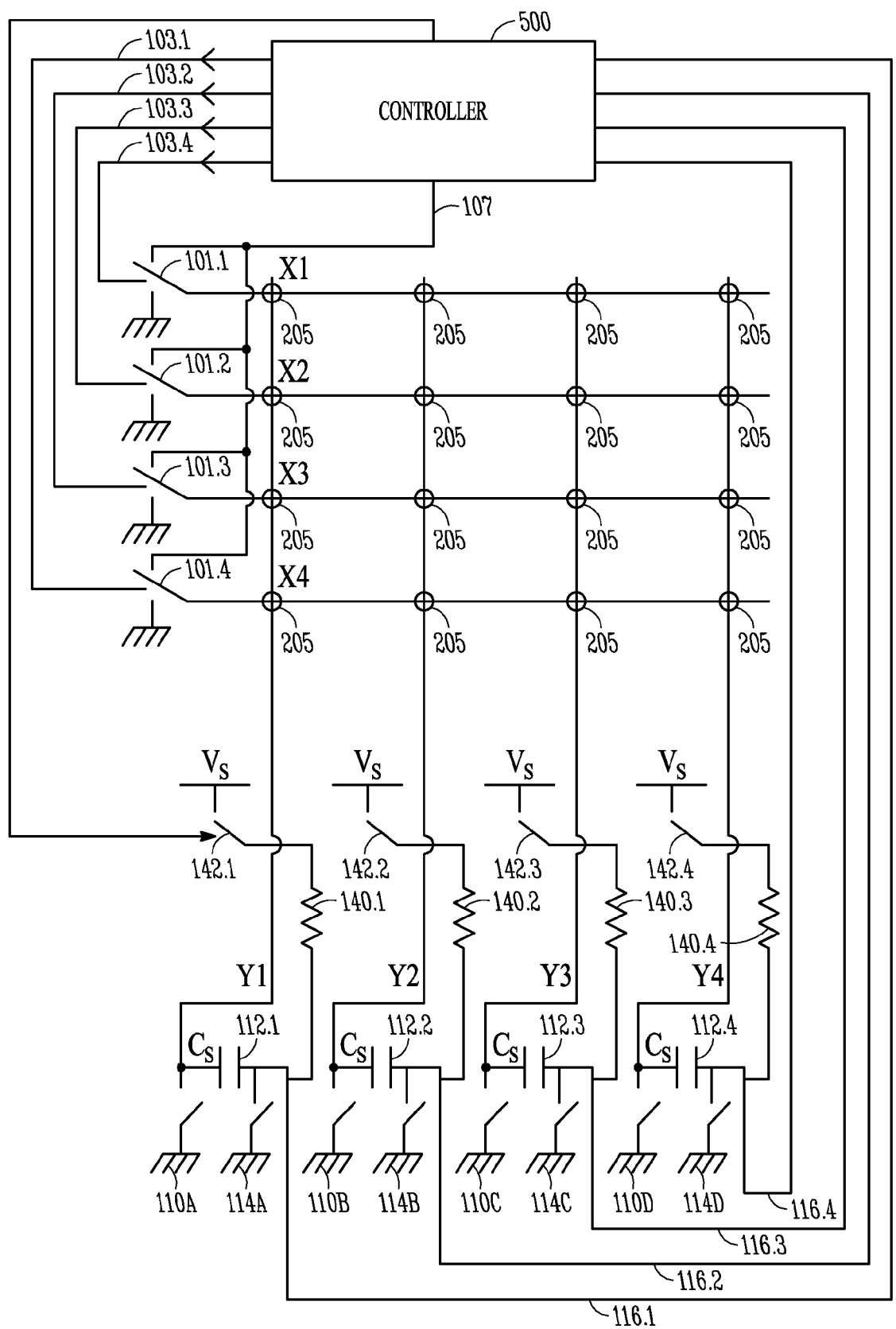
FIG. 5 is a circuit diagram illustrating a touch sensitive matrix providing a two-dimensional capacitive transducing sensor arrangement.
Figure 6:
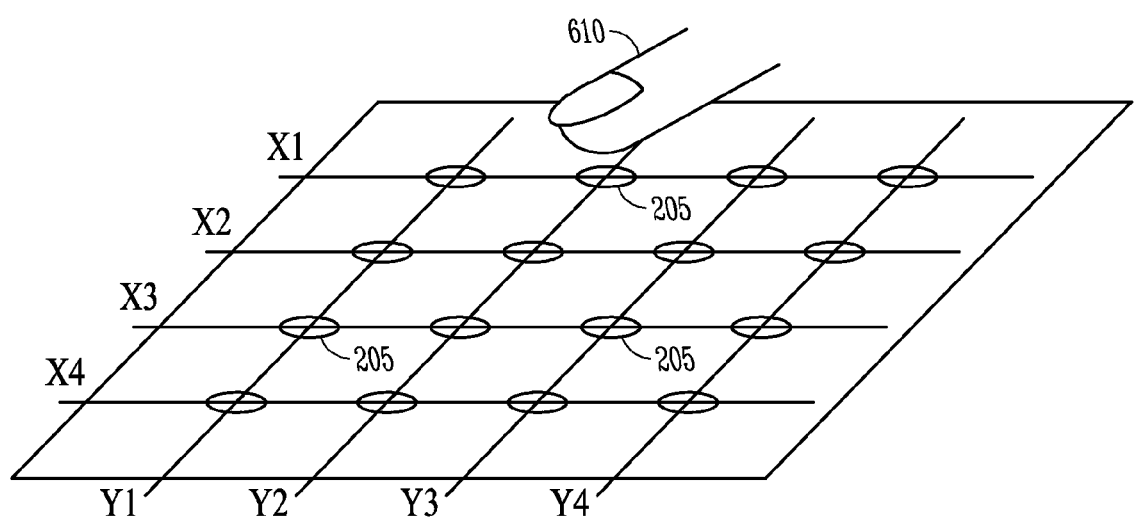
FIG. 6 is a schematic illustration showing the touch sensitive matrix shown in FIG. 5.

One advantage of the measurement circuit shown in FIG. 3 is that, using the same principles of construction and operation, a matrix of touch sensitive switches can be formed, so that a user can select either a plurality of different positions on a touch sensitive screen, for example, or a plurality of different functions in dependence upon position of the user's finger for example with respect to the matrix of points. FIGS. 5 and 6 provide an example of a two dimensional touch sensor.

In FIG. 5, drive circuits 101.1, 101.2, 101.3, 101.4 are arranged to drive different sensor points 205 which form a 4×4 array of channels, although it will be appreciated that any size of array can be used. Thus, as illustrated correspondingly in FIG. 5 a control panel with sixteen touch sensitive points, or channels, is provided which can be used to either form the touch sensitive screen or a control panel with multiple selection control switches. As shown in FIG. 5, each of the drive circuits 101.1, 101.2, 101.3, 101.4 is controlled by a controller 500 to drive each of the corresponding drive lines X1, X2, X3, X4, using first control inputs 103.1, 103.2, 103.3, 103.4, respectively, in the same way as the X plate 100 is driven in FIG. 3 and represented in FIG. 4. An input on line 107 is also shown which provides the reference voltage $V_R$. The output of the coupling capacitors at each of the points 205 are connected to one side of charge measurement capacitors Cs 112.1, 112.2, 112.3, 112.4 which are arranged to measure an amount of charge present on the Y plate, Y1, Y2, Y3, Y4 provide output signals 116.1, 116.2, 116.3, 116.4 to detect the presence of an object in the same way as the operation of the circuit in FIG. 3 and FIG. 4. This is achieved by applying control signals to the switches 110A, 110B, 110C, 110D, 114A, 114B, 114C, and 114D in a corresponding manner to the arrangement explained above with reference to FIGS. 3 and 4. More details for the operation of such a matrix circuit are disclosed in U.S. Pat. No. 6,452,514.

Technical Problem Addressed by Example Embodiments

As shown in FIG. 6, it is known to provide an arrangement in which a charge measurement is effected for a touch sensor having a plurality of channels, so that a multi-input control or a two dimensional touch sensor can be implemented. As will be appreciated from the description provided above, each of the channels, represented as a drive, sense pair of electrodes (X, Y), on the touch sensor provides a sensing point.

In order for the controller 500 to detect a change in the capacitance of each of the sensing points in the two dimensional matrix, each of the drive circuits 101.1, 101.2, 101.3, 101.4 is controlled to drive each of the corresponding lines X1, X2, X3, X4, in turn. Thus, using first control inputs on control lines 103.1, 103.2, 103.3, 103.4 the X plates for each of the input or drive lines X1, X2, X3, X4 are driven in turn, which pushes charge onto the receiving Y plates, which are connected to the corresponding drive line X1, X2, X3, X4. Therefore, for example, for the first of the drive lines X1, all of the X plates which are coupled to the X1 line are driven which pushes charge onto the receiving plates Y1, Y2, Y3, Y4 which are at the intersection points of that drive line X1. Therefore, when each of the charge sensing circuits, which includes the measurement capacitors 112.1, 112.1, 112.3, 112.4, is used in turn to measure the amount of charge transferred from a corresponding receiving Y plate, after having been driven by the first drive line X1, a change in an amount of capacitance for each of the channels (X1,Y1), (X1,Y2), (X1,Y3), and (X1,Y4) which are connected to the X1 drive line, can be determined. Thus, by driving each of the drive lines X1, X2, X3, X4 in turn and measuring the charge induced on each of the measurement capacitors 112.1, 112.1, 112.3, 112.4 in turn, it is possible to identify a change in capacitance of any of the channels provided at the intersection points of the X lines and the Y lines of the two dimensional touch sensor. The change in the capacitance at any of the intersection points therefore provides in indication of the proximity of a body at the corresponding locations in the two dimensional planes provided by the touch sensor.

As will be appreciated from the above explanation, in order to identify a location of a body at any position in the two dimensional plane, it is necessary to drive each of the N drive lines X1, X2, X3, X4 in turn, and then measuring the charge induced on each of the M charge measurement capacitors Y1, Y2, Y3, Y 4 in turn. In other embodiments, N and M may be other values.

As such, in order to detect the location of a body proximate the two dimensional touch sensor, an amount of time approximately equal to N*M*t, will be required, in which "t" is the average time taken to measure the charge present on one of the measurement capacitors 112.1, 112.2, 112.3, 112.4.

As shown in FIG. 5, and in correspondence with arrangements shown in FIG. 3, each of the charge measurement capacitors Cs 112.1, 112.2, 112.3, 112.4, includes an arrangement of a discharge resistors SMP 140.1, 140.2, 140.3, 140.4, and switches 142.1, 142.2, 142.3, 142.4, which is controlled in either of two positions. The two positions of the switches 142.1, 142.2, 142.3, 142.4 which are connected to a corresponding discharge resistor 140.1, 140.2, 140.3, 140.4, connect the discharge resistor either to float (Z) or to connect to a positive voltage $V_S$. Thus, as explained above with reference to FIG. 3, the switches 142.1, 142.2, 142.3, 142.4 are arranged to discharge the charge measurement capacitors Cs 112.1, 112.2, 112.3, 112.4 in order to measure an amount of charge which has accumulated on the measurement capacitors 112.1, 112.2, 112.3, 112.4 transferred from the receiving Y-plate of the channel, Y1, Y2, Y3, Y4. As indicated above, each of the drive lines of the X-plate, X1, X2, X3, X4, is driven in turn to identify a proximity of an object to a part of the two dimensional touch sensor from the charge induced by the X-plate of the channel on to the receiving Y-plate Y1, Y2, Y3, Y4. By then measuring the charge on each of the Y-plates by discharging the respective charge measurement capacitances in turn, it is possible to identify the location of a user's finger 610, for example, proximate the two dimensional touch sensor. Thus, as illustrated in FIG. 6, the location of the user's finger 610 proximate one of the channels (X1, Y2) can be identified.

Example Operation of the Present Technique

Figure 7A:
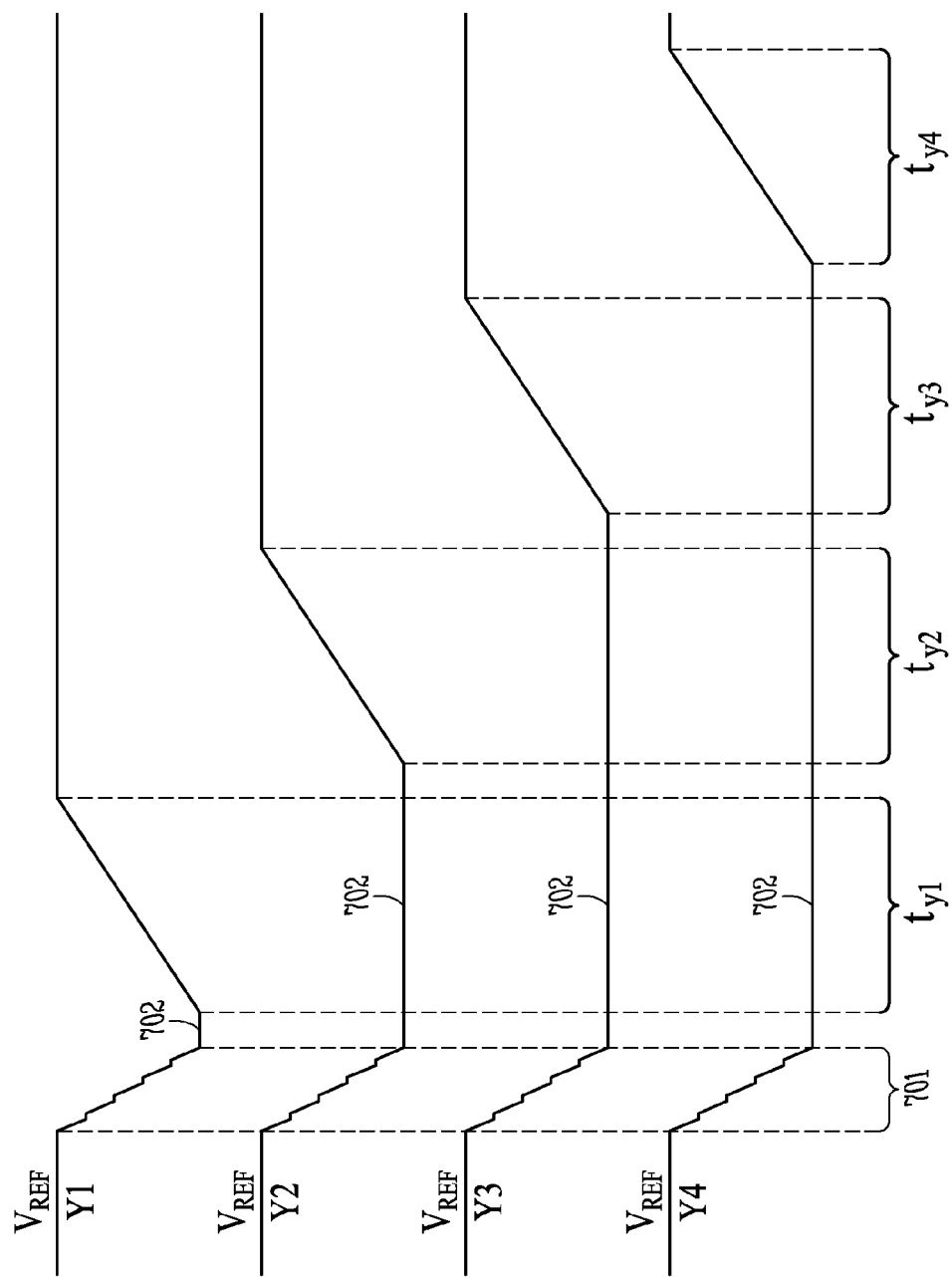
FIG. 7A is a graphical representation of a plot of signal charge or voltage across each of a plurality of measurement capacitors with respect to time for the example touch sensor shown in FIG. 5.

An arrangement for performing a parallel pre-discharge of the measurement capacitors Cs 112.1, 112.2, 112.3, 112.4 is illustrated by the graphical representations of FIGS. 7A, 7B, 8A and 8B. FIG. 7A provides a graphical representation showing a voltage across each of the four charge measurement capacitors 112.1 112.2 112.3 112.4 for each of the receiving lines Y1, Y2, Y3, Y4. Thus, during a first part 701 of a process for detecting the presence of an object proximate one of the channels of the touch sensor, the arrangement for bursting the channels on one of the drive lines, such as one of lines X1, X2, X3, X4, is as explained with reference to FIGS. 1 to 6. Thus, across each of the charge measurement capacitors Cs 112.1, 112.2, 112.3, 112.4 a voltage is accumulated as a result of an accumulation of the charge transferred from the corresponding receiving Y-plate line Y1, Y2, Y3, Y4 of the channel resulting in a change in voltage across the Cs capacitors from the reference voltage to a voltage indicated at 702. Thereafter, in order to detect the presence of an object proximate one of the receiving channels Y1, Y2, Y3, Y4 of that drive line X1, the charge across the corresponding charge measurement capacitors 112.1, 112.2, 112.3, 112.4 is discharged as explained with reference to FIGS. 5 and 6.

As mentioned above, the representation of the charge present across the charge measurement capacitor is represented by a count of clock cycles which is used to discharge the charge measurement capacitor Cs to zero. Thus, as shown in FIG. 7A for example, an amount of time $t_{y1}$ which is used to discharge the first charge measurement capacitor from the Y1 line, which may be represented as a count of clock cycles, for example 100 clock cycles.

As will be appreciated from the diagram shown in FIG. 7A in order to discharge each of the charge measurement capacitors for each of the receiving lines Y1, Y2, Y3, Y4, a total time may be equal to the sum of the individual times, for example, $t_{y1}+t_{y2}+t_{y3}+t_{y4}$. It is desirable to reduce the amount of time used to perform a measurement of charge from each of the charge measurement capacitors in order to improve the sensitivity of the touch sensor.

One solution is to measure the charge present on each of the measurement capacitors 112.1, 112.2, 112.3, 112.4 in parallel. However, to do this, each of the charge measurement circuits for each of the charge measurement capacitors 112.1, 112.2, 112.3, 112.4 may use a separate comparator or analog to digital converter. Furthermore, the controller 500 may process the samples of the counts corresponding to the discharging of the measurement capacitors in parallel. Therefore, to reduce cost and complexity some embodiments may perform the measurements of charge for each of the charge measurement capacitors 112.1, 112.2, 112.3, 112.4 in series, by measuring the charge present on each of the measurement capacitors 112.1, 112.2, 112.3, 112.4 sequentially, such that a single analog to digital converter and one interface to the controller 500 is used.

According to an example embodiment, to reduce an amount of time to perform the measurement of the charge across each of the charge measurement capacitors 112.1, 112.2, 112.3, 112.4 for each of the receiving lines Y1, Y2, Y3, Y4, the controller 500 performs a parallel discharge of each of the charge measurement capacitors 112.1, 112.2, 112.3, 112.4. This is done before performing the measurement of the charge remaining on each of the charge measurement capacitors 112.1, 112.2, 112.3, 112.4 sequentially. To this end, a pre-determined range of measurement values corresponds to the presence or absence of an object proximate any of the channels of the touch sensor. This may be established during an initialization phase or may be pre-set within the controller.

An amount of change of charge could be measured in accordance with a range of measurement values, which will correspond to the presence or to the absence of a body proximate the touch sensor during an initialization phase, or is pre-set within the controller 500. The amount of discharge is therefore determined in accordance with a likely range of measurements which will correspond to the presence or absence of an object proximate the channel of the touch sensor.

Figure 7B:
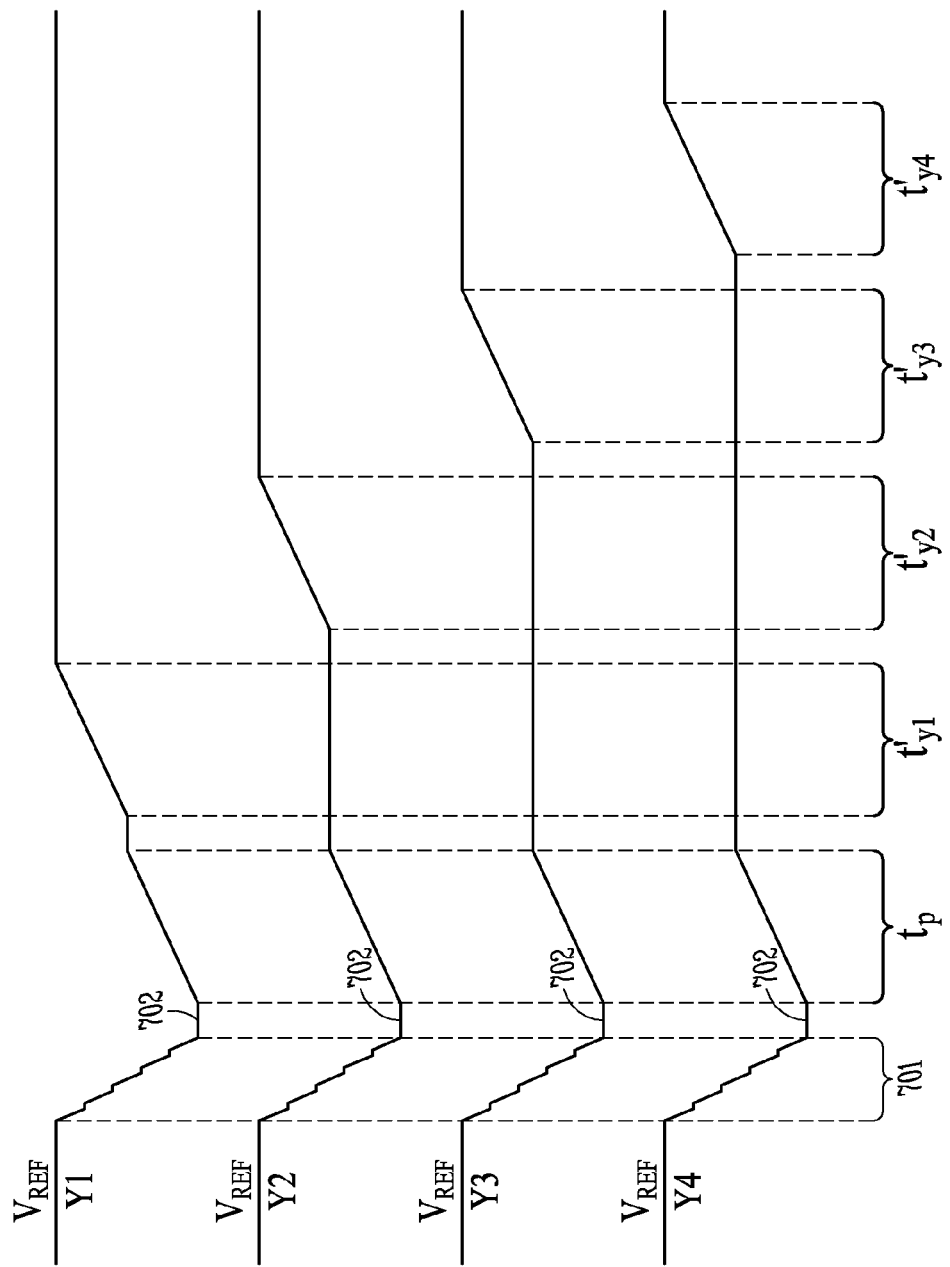
FIG. 7B is a graphical representation of a plot of signal charge or voltage across each of the plurality of measurement capacitors with respect to time of FIG. 7A illustrating a parallel pre-discharge process of the present technique.

This likely dynamic range of measurements therefore determines an amount by which the measurement capacitors may be discharged before the measurement is taken. FIG. 7B provides a graphical representation of the discharge of the measurement capacitors in correspondence with the examples shown in FIG. 7A. As shown in FIG. 7B each of the charge measurement capacitors 112.1, 112.2, 112.3, 112.4 is discharged by an amount "$D_D$," which may correspond to a count of cycles or to a specific voltage. The amount of the discharge $D_D$ of each of the charge measurement capacitors 112.1, 112.2, 112.3, 112.4 is set in accordance with the expected dynamic range for measuring the presence of the body which is represented by a second count "$D_M$," which may again be represented as a count of cycles or as a voltage. Thus as shown in FIG. 7B, the charge measurement capacitors 112.1, 112.2, 112.3, 112.4 are discharged for an amount of time "$t_p$," such that the time for measuring the charge for each of the charge measurement capacitors 112.1, 112.2, 112.3, 112.4 is correspondingly reduced.

For example, the time taken to measure the charge present on the first charge measurement capacitor 112.1 for the receiving line Y1 becomes $t'_{y1}=t_{y1}-t_p$. Thus for each of the corresponding charge measurement processes for each of the remaining receiving lines Y2, Y3, Y4 a time saving is provided of approximately $3*t_p$ so that the total time to perform the charge measurements for all of the Y lines becomes:

$$\text{total time}=t_p+(t_{y1}-t_p)+(t_{y2}-t_p)+(t_{y3}-t_p)+(t_{y4}-t_p)$$

Figure 8A:
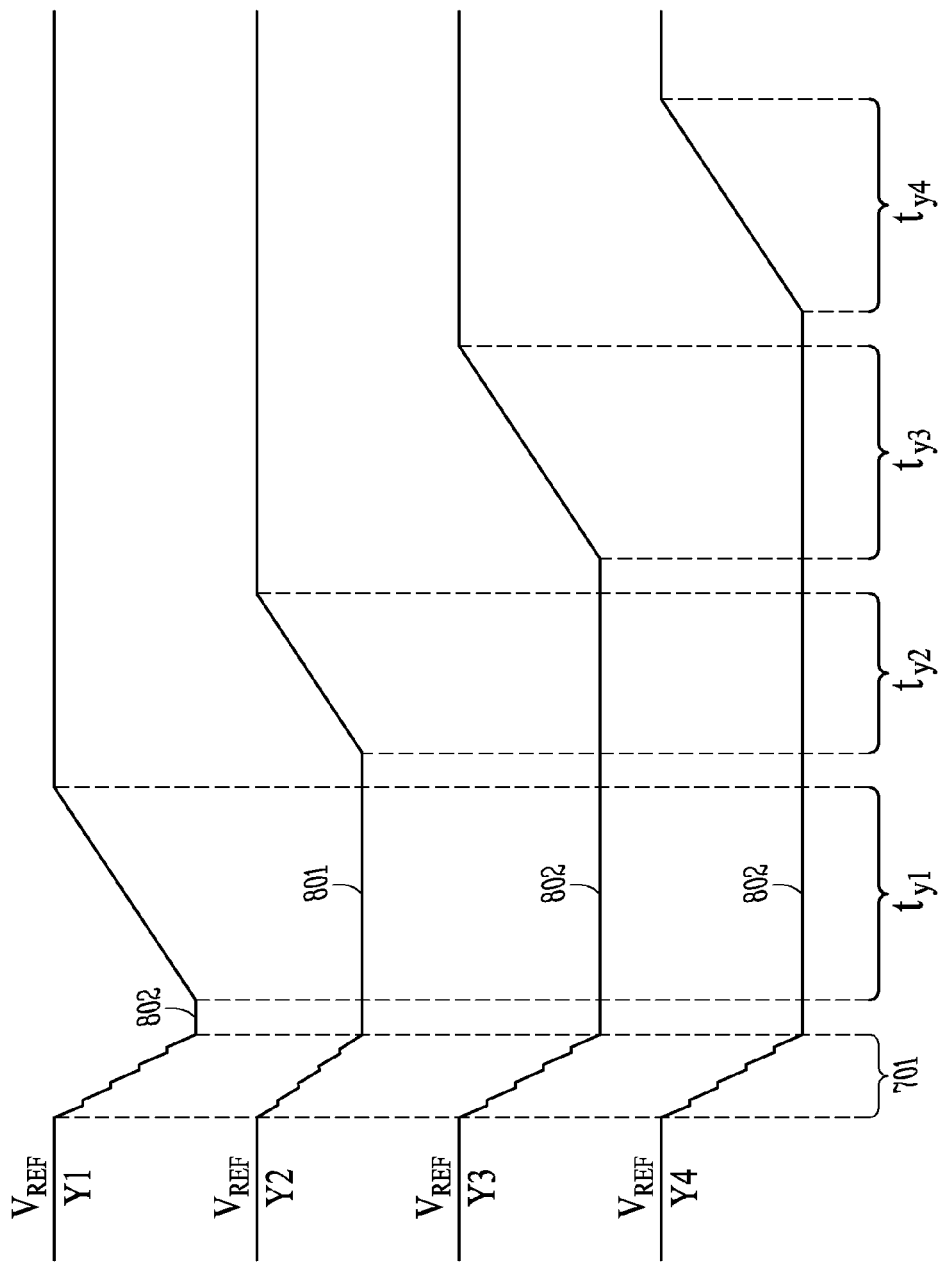
FIG. 8A is a graphical representation of a plot of signal charge or voltage across each of the plurality of measurement capacitors with respect to time corresponding to the example shown in FIG. 7A with a body present proximate one of the channels.
Figure 8B:
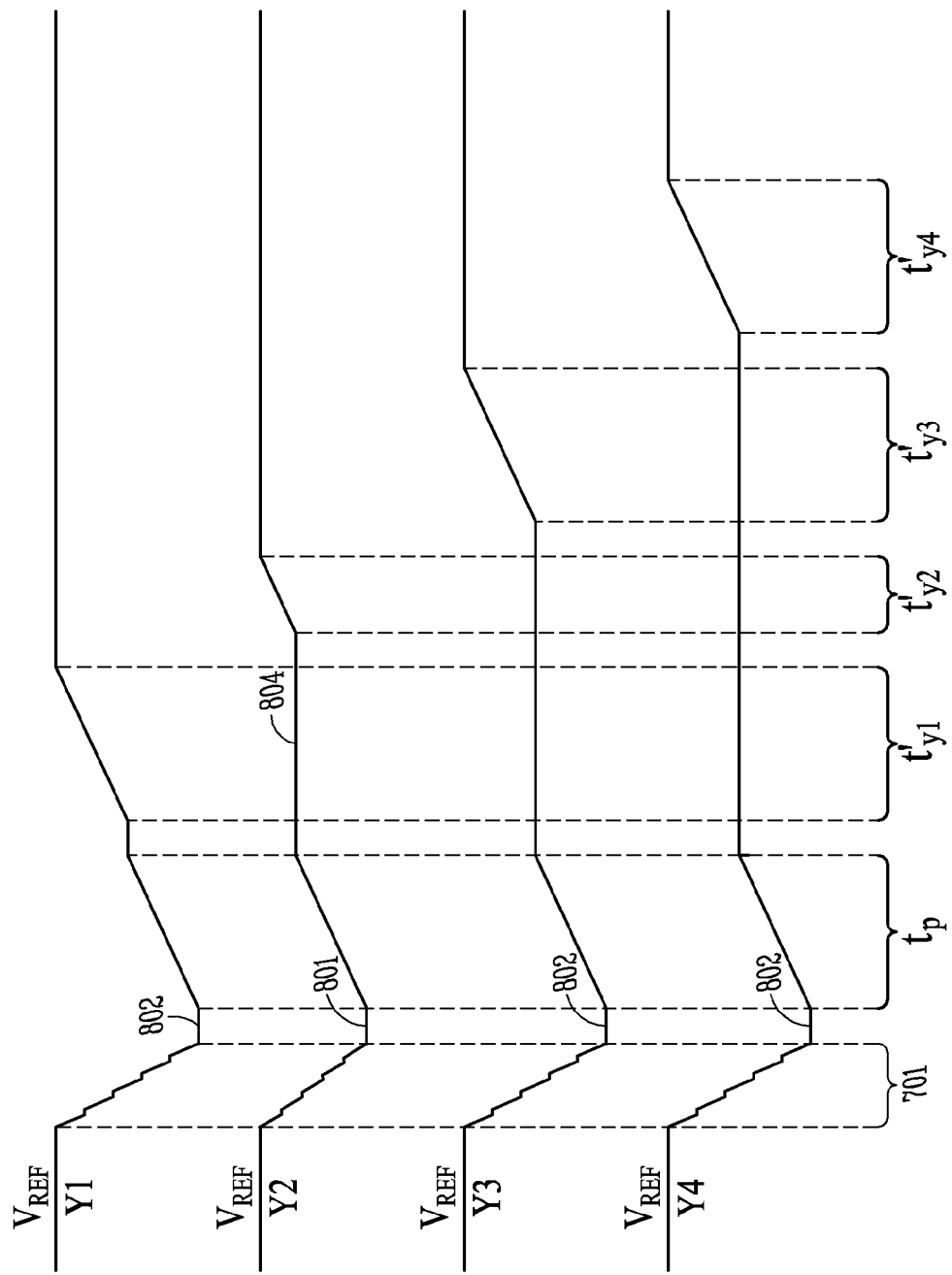
FIG. 8B is a graphical representation of a plot of signal charge or voltage across each of the plurality of measurement capacitors with respect to time of FIG. 8A illustrating a parallel pre-discharge process of the present technique.

FIGS. 8A and 8B illustrate corresponding graphical representations of voltage across the charge measurement capacitors 112.1, 112.2, 112.3, 112.4 to illustrate the parallel pre-discharge process but with the example of FIG. 6, where the user's finger 610 is proximate a second set of the receiving channels (X1,Y2). Thus as shown in FIG. 8A, the voltage across the measurement capacitor 112.2, which is illustrated by a line 801, as a result of an amount of charge transferred from the corresponding receiving line Y2 is substantially less than that when the user's finger 610 is not present. Therefore, the charge present on the charge measurement capacitor 112.2 is substantially less than the voltage across the other charge measurement capacitors 112.1, 112.3, 112.4, which has been transferred from the receiving plates Y1, Y3, Y4 as represented by a line 802. Thus, as shown in FIG. 8A, a time taken for the measurement capacitor 112.2 for the sense line Y2 to reach zero is $t_{y2}$, which is less than the time taken to reach zero for the other receiving lines. This difference in time is therefore an indication of the presence of the user's finger proximate the receiving plate of the channel (X1, Y2).

Correspondingly, for the example where a parallel pre-discharge takes place of all of the charge measurement capacitors 112.1, 112.2, 112.3, 112.4 across each of the receiving lines Y1, Y2, Y3, Y4, FIG. 8B shows that the parallel pre-discharge of all of the charge measurement capacitors 112.1, 112.2, 112.3, 112.4 causes the charge to be reduced across the measurement capacitor 112.2 for the channel (X1, Y2), which is illustrated by a line 804. There is still, however, sufficient dynamic range for a discharge of the charge measurement capacitor Cs 112.2 for a time $t'_{y2}$ from which the presence of an object may be detected.

Summary of Operation

Figure 9:
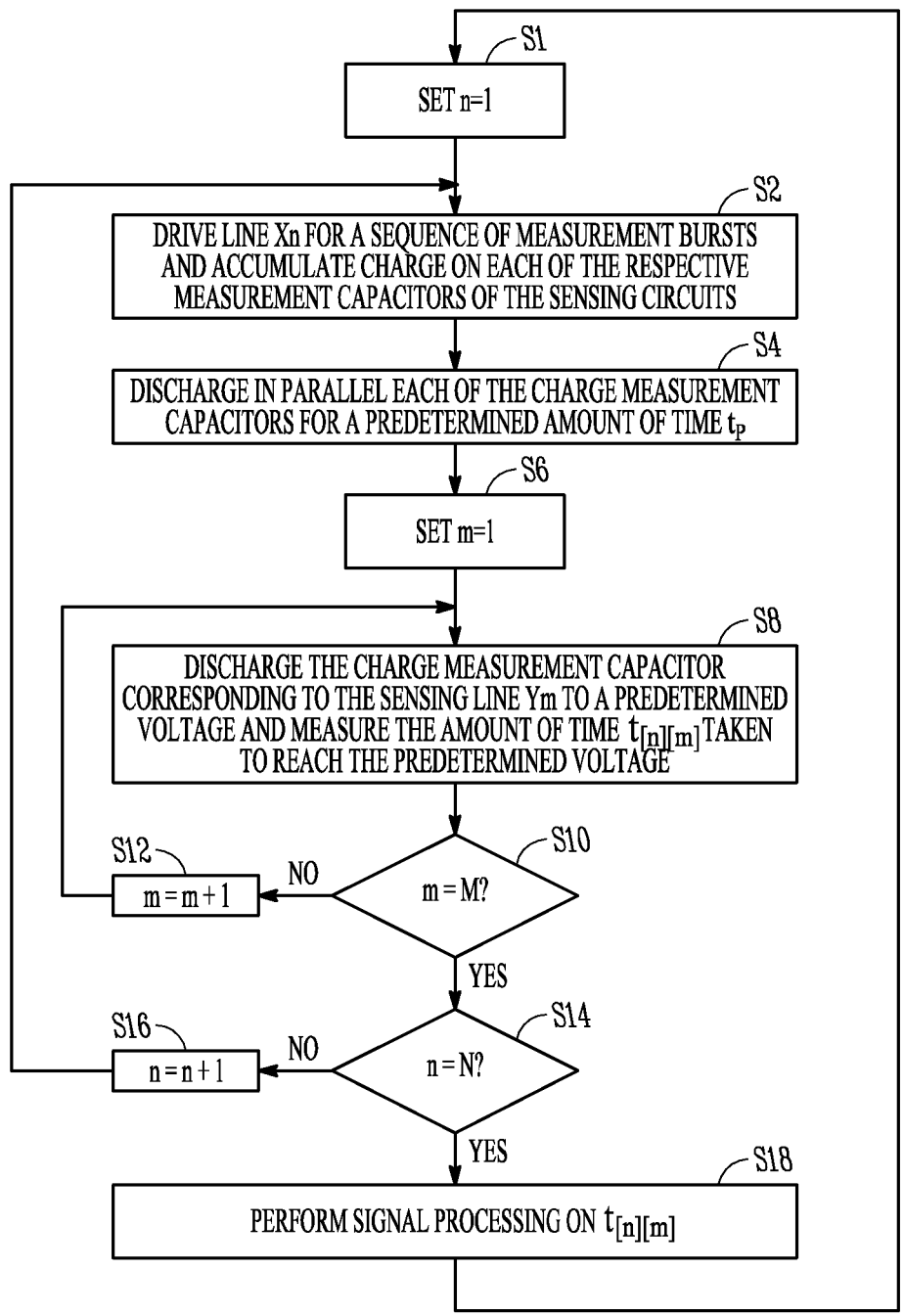
FIG. 9 is a flow diagram representing the operation of a touch sensor according to the present technique.

A flow diagram illustrating the process for detecting the presence of a body on a two dimensional touch sensor which incorporates the above-mentioned parallel pre-discharged processes as shown in FIG. 9

The process of FIG. 9 begins at S1, wherein a FOR loop is initialized to process each of the drive lines X1, X2, X3, X4 in turn. The FOR loop includes activities to drive each of the drive lines X1, X2, X3, X4 (for n=1 to N).

The FOR loop activities are illustrated from S2, wherein the state of the FOR loop in S1 determines if the drive line Xn is driven by one of the corresponding drive circuits. When one of the drive lines is being driven, a charge is induced on the receiving lines Y1, Y2, Y3, Y4 through locations corresponding to that drive line Xn. Accordingly, the charge measurement capacitors 112.1, 112.2, 112.3, 112.4 are charged as a result of a series of bursts, as explained with reference to FIGS. 1 to 4.

The process continues at S4 in a manner as explained herein above for a pre-determined amount of time $t_p$, or for an amount of voltage or for a cycle count. Each of the charge measurement capacitors 112.1, 112.2, 112.3, 112.4 is discharged in parallel.

The processing begins at S6 for activities wherein each of the receiving lines Y1, Y2, Y3, Y4 and the corresponding charge measurement capacitor Cs 112.1, 112.2, 112.3, 112.4 of the measurement circuit, a FOR loop is performed for each of the values for m=1 to M, to perform an analysis of the charge remaining on the charge measurement capacitor.

At S8, each charge measurement capacitor is discharged, in turn, to a pre-determined value, for example, zero. In one embodiment, channel discharge measurement times may be measured in terms of counts of clock cycles to reach this value, and may be noted as a set of numbers t[n][m], where n corresponds to the drive line, and m corresponds to the sense line forming the channel. Thus, each of the receiving lines Y1, Y2, Y3, Y4, is processed in turn by the controller 500 and a corresponding measurement taken of a time required to discharge the corresponding charge measurement capacitor 112.1, 112.2, 112.3, 112.4. The time taken to discharge each charge measurement capacitor is stored for later comparison with ranges of values.

At S10, the FOR loop is checked for the sequence of processing the charge measurement capacitors, to determine whether the last measurement capacitor has been processed. Thus if m=M, such as four in the illustrated examples, then processing passes to step S14, otherwise processing passes to step S12.

When the count of the variable m is increased in accordance with the sequential processing of the M charge measurement capacitors, operation S12, processing proceeds to operation S8 for the next charge measurement capacitor. At decision point S14, the process checks the state of the FOR loop for the drive line Xn under consideration, by determining whether a last of the drive lines X, where n=N and N is the total number of drive lines, has been processed, for example whether with n=4. If no, e.g., n≠N, then processing proceeds to step S16 where the next drive line n is processed by increasing n for n=n+1 and then proceeding to step S2.

Processing continues to operation S18 and if the final drive line (n=4) has been processed, then the controller determines whether or not a body has been detected proximate one of the channels of the touch sensor in accordance with the measurements taken for each of the channels by processing each of the drive lines X in turn and each of the receiving lines Y1, Y2, Y3, Y4. Thereafter processing returns to step S1, wherein Steps S1 to S18 are repeated.

Figure 10:
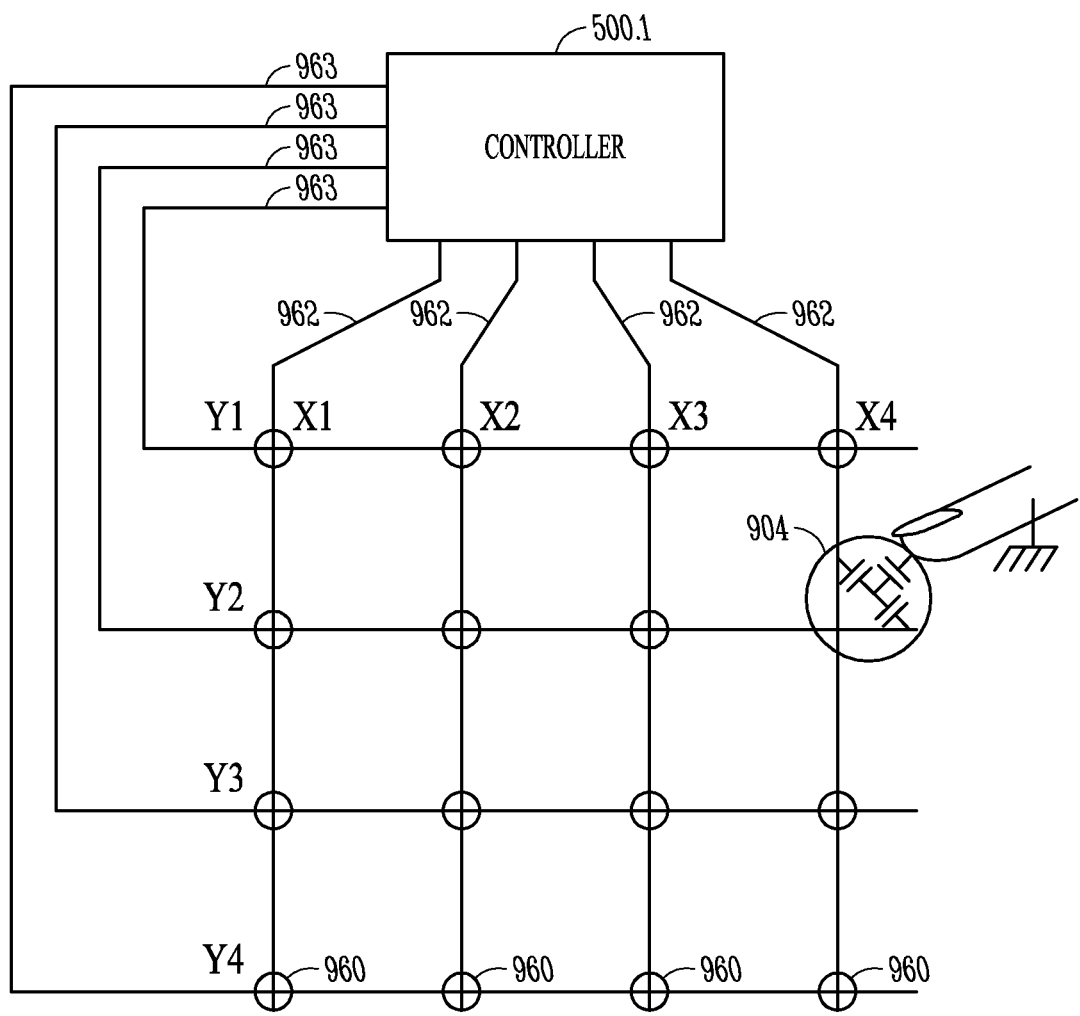
FIG. 10 is a circuit diagram of a further example of a two-dimensional touch sensor adapted in accordance with an example embodiment.

As explained above, embodiments find application with various forms of touch sensor and include touch sensors in which a channel is first charged and then discharged such as in the example disclosed in U.S. Pat. No. 5,730,165. In this example, which is illustrated in FIG. 10, each channel provides a single coupling plate 960. As for the examples explained above, a controller 500.1 drives charge to a drive line, such as X1, X2, X3, X4, which is then transferred or induced to the coupling point 960 where the drive line intersects each sense line and identifies the location of a channel. The process then involves measuring an amount of charge transferred from the plate 960 to a charge measurement capacitor in order to detect a change in capacitance at the coupling plate 960.

As illustrated in FIG. 10, the change in capacitance may be caused by the presence of a body, which is illustrated as a capacitance C 904. As illustrated in FIG. 10, a plurality of channels 960 are coupled to drive lines 962, which are controlled by the controller 500.1. The controller 500.1 charges the drive lines 962 during a drive part of a measurement cycle and discharged by sensing lines 963.

In accordance with an example embodiment, after driving the coupling plates 960, on one of the common driving lines 962, the plates 960 are discharged in parallel in accordance with the parallel pre-discharge technique explained above, in order to reduce an amount of time taken to detect the presence of a body proximate one of the coupling plates 960. As will be appreciated, some embodiments have application to any form of touch sensor in which a plurality of sensing channels or plates are charged and then charge measurement circuits are applied sequentially to measure the charge on the channels or coupling plates. For example, a linear position sensor may have a single set of channels, which may be arranged linearly to provide linear position control. According to some embodiments, the channels may be charged by a common drive line, and then a parallel pre-discharge process may be applied to discharge the channels or coupling plates before the charge is sensed for each channel or plate in sequence.

In some example implementations, the sensor may be used with capacitive sensing apparatus and methods described in U.S. Pat. No. 6,452,514.

In one example, the sensing element, which forms the channel or channels, may comprise a pattern of electrodes. The electrodes may be made of a transparent material, such as Indium Tin Oxide (ITO) or other suitable material for use in a touch sensor.

A more detailed example of a two dimensional touch sensor is provided in US Patent Application having Publication No. US2006/0279395. A further example of a touch sensor with which some embodiments find application is disclosed in U.S. Pat. No. 6,466,036.

The invention claimed is:
1. An apparatus, comprising:
a plurality of charge measurement capacitors configured to couple to a plurality of channels of a touch sensor; and
a controller configured to:
control transferring charge to each of the plurality of channels;
control coupling each of the plurality of charge measurement capacitors to one of the plurality of channels such that charge is transferred to each of the plurality of charge measurement capacitors;
control a first discharge of each of the charge measurement capacitors in parallel;
control, after the first discharge, a second discharge of each of the measurement capacitors sequentially; and determine, based on the second discharge, an amount of charge that was remaining in each of the charge measurement capacitors after the first discharge.

2. The apparatus as claimed in claim 1, wherein during the first discharge, each of the charge measurement capacitors is discharged a predetermined discharge amount.

3. A touch sensor, comprising:
a plurality of channels;
a drive circuit coupled to each of the channels;
for each of the channels, a charge sensing circuit, each of the charge sensing circuits including a charge measurement capacitor; and
a controller coupled to the drive circuit and the charge sensing circuit, the controller being operable to:
control the drive circuit to induce charge onto each of the channels during a drive part of a measurement cycle;
control each of the charge sensing circuits to couple a respective charge measurement capacitor to one of the channels during a charge measurement part of the measurement cycle such that the charge induced onto the channel during the drive part of the measurement cycle is transferred to the respective charge measurement capacitor;
control a first discharge of each of the charge measurement capacitors in parallel;
control, after the first discharge, a second discharge of each of the measurement capacitors sequentially; and
determine, based on the second discharge, an amount of charge that was remaining in each of the charge measurement capacitors after the first discharge.

4. A touch sensor as claimed in claim 3, wherein during the first discharge, each of the charge measurement capacitors is discharged a predetermined discharge amount.

5. A touch sensor as claimed in claim 4, wherein the predetermined discharge amount is set in accordance with an expected amount of charge present on each of the signal measurement capacitors as a result of the presence of an object proximate a corresponding one of the channels of the touch sensor.

6. A touch sensor as claimed in claim 5, wherein the predetermined discharge amount is determined by measuring a range of values of the expected charge values on each of the charge measurement capacitors for each of the channels as a result of the presence and absence of an object and setting the predetermined discharge amount in accordance with the expected range of values.

7. A touch sensor as claimed in claim 3, wherein each of the channels of the touch sensor is an intersection of a drive line and a receiving line, each receiving line being coupled to a corresponding charge measurement capacitor of the charge sensing circuit, and the controller is operable to control the drive circuit to drive each of the plurality of drive lines during the drive portion of the measurement cycle, and to control the charge sensing circuit to transfer charge on the plurality of receiving lines to the plurality of charge measurement capacitors during the measurement portion of the measurement cycle.

8. A touch sensor as claimed in claim 3, wherein each of the plurality of channels of the touch sensor comprises a coupling plate, and the controller is arranged to control the drive circuit to:
charge the coupling plate of each of the plurality of channels during the drive part of the measurement cycle, and
control the charge sensing circuit to transfer charge from each coupling plate of each of the plurality of channels to a corresponding one of the charge measurement capacitors of the charge sensing circuit during the measurement part of the measurement cycle.

9. A touch sensor as claimed in claim 3, the touch sensor further comprising a plurality of drive circuits each of which is coupled to a first set of the plurality of channels via a common drive line, wherein the charge sensing circuit is coupled to a different set of the plurality of channels via common receiving lines, wherein the plurality of channels are disposed on a two dimensional surface to form a two dimensional touch sensor.

10. A method, comprising:
controlling a drive circuit coupled to each of a plurality of channels of a touch sensor to induce charge onto each of the plurality of channels during a drive part of a measurement cycle;
controlling a charge sensing circuit for each of the plurality of channels to couple a charge measurement capacitor respectively to the each of the plurality of channels during a charge measurement part of the measurement cycle to the effect that the charge induced on the at least one of the plurality of channels during the drive part of the measurement cycle is transferred to at least one respective capacitor of the charge measurement capacitors of the charge sensing circuits;
controlling a first discharge of each of the charge measurement capacitors in parallel;
controlling, after the first discharge, a second discharge of each of the measurement capacitors sequentially; and
determining, based on the second discharge, an amount of charge that was remaining in each of the charge measurement capacitors after the first discharge.

11. A method as claimed in claim 10, wherein during the first discharge, each of the charge measurement capacitors is discharged a predetermined discharge amount.

12. A method as claimed in claim 11, wherein the predetermined discharge amount is set in accordance with an expected difference in the amount of charge present on each of the measurement capacitors as a result of the presence of the object proximate a corresponding one of the plurality of channels of the touch sensor.

13. A method as claimed in claim 12, comprising determining, during an initialization phase, the predetermined discharge amount, by measuring a range of expected charge values on each of the charge measurement capacitors for each of the plurality of channels as a result of the presence of an object and setting the predetermined discharge amount in accordance with the range of expected charge values.

14. A method as claimed in claim 12, wherein the predetermined discharge amount is pre-set in accordance with the expected range in charge values on each of the measurement capacitors as a result of the presence and absence of an object.

15. A method as claimed in claim 10, wherein each of the plurality of channels of the touch sensor comprises a drive plate and a receiving plate, each of the drive plates being coupled to the drive circuit and each of the receiving plates being coupled to a corresponding charge measurement capacitor of one of the charge sensing circuits, and the controlling the drive circuit to induce charge onto each of the plurality of channels during a drive part of a measurement cycle, includes driving the drive plate of the plurality of channels during the drive part of the measurement cycle, and the controlling the charge sensing circuit for each of the plurality of channels to couple the charge measurement capacitor respectively to each of the plurality of channels during the charge measurement part of the measurement cycle includes, for each channel controlling the charge sensing circuits to transfer the charge induced on the receiving plate to the charge measurement capacitor during the measurement portion of the measurement cycle.

16. A method as claimed in claim 10, wherein each of the plurality of channels of the touch sensor comprises a coupling plate, and the controlling the drive circuit to induce charge onto each of the plurality of channels during the drive part of the measurement cycle, includes driving the coupling plate of the plurality of channels during the drive part of the measurement cycle, and the controlling the charge sensing circuit for each of the plurality of channels to couple the charge measurement capacitor respectively to one of the plurality of channels during the charge measurement part of the measurement cycle includes, for each of the plurality of channels controlling the charge sensing circuits to transfer the charge induced on the coupling plates of each of the plurality of channels to a corresponding one of the charge measurement capacitors of the charge sensing circuits during the measurement part of the measurement cycle.

17. A method as claimed in claim 13, wherein the controlling the drive circuit to induce charge onto each of the plurality of channels during the drive part of the measurement cycle, includes controlling a plurality of drive circuits, each of which is coupled to the plurality of channels via common drive lines, to induce charge onto each of the plurality of channels, and the controlling the charge sensing circuit for each of the plurality of channels to couple one of the charge measurement capacitors respectively to one of the plurality of channels during the charge measurement part of the measurement cycle to transfer the charge to each of the respective charge measurement capacitors, includes controlling each of the charge sensing circuits to couple a different set of the plurality of channels via common receiving lines to transfer the charge induced on each of the plurality of channels to one of the charge measurement capacitors, the plurality of channels being disposed on a two dimensional surface to form a two dimensional touch sensor.

18. A touch sensitive control panel comprising:
a channel matrix comprising
    a first plurality of drive lines having N drive lines,
    a second plurality of sense lines, having M sense lines,
    wherein the channel matrix includes a number of channels equal to N multiplied by M, each of the channels being arranged to sense the presence of an object, each of the channels being disposed adjacent a respective intersection of one of the N drive lines and one of the M sense lines, each of the channels comprising a drive plate (X) connected to one of the N drive lines and a receiving plate (Y) connected to one of the M sense lines, each of the N drive lines is connected to a respective drive circuit, each of the M sense lines is connected to a respective charge sensing circuit including a charge measurement capacitor, and the channel matrix includes a controller, the controller being operable to:
    control each drive circuit to induce charge onto each drive plate of each of the M sense lines connected to each of the N drive lines during a drive part of a measurement cycle;
    control each charge sensing circuit to couple each charge measurement capacitor respectively to the receiving plate of each of the channels during a charge measurement part of the measurement cycle to the effect that the charge induced on each receiving plate of each channel during the drive part of the measurement cycle is transferred to each respective charge measurement capacitor;
    control a first discharge of each of the charge measurement capacitors in parallel;
    control, after the first discharge, a second discharge of each of the measurement capacitors sequentially; and
    determine, based on the second discharge, an amount of charge that was remaining in each of the charge measurement capacitors after the first discharge.

19. A method, comprising:
controlling a first discharge of each of a plurality of charge measurement capacitors in parallel, each of the plurality of charge measurement capacitors corresponding to one of a plurality of channels of a touch sensor;
controlling, after the first discharge, a second discharge of each of the measurement capacitors sequentially; and
determining, based on the second discharge, an amount of charge that was remaining in each of the charge measurement capacitors after the first discharge.

20. An apparatus, comprising:
control circuitry operable to:
    control a first discharge of each of a plurality of charge measurement capacitors in parallel, each of the plurality of charge measurement capacitors corresponding to one of a plurality of channels of a touch sensor;
    control, after the first discharge, a second discharge of each of the measurement capacitors sequentially; and
    determine, based on the second discharge, an amount of charge that was remaining in each of the charge measurement capacitors after the first discharge.

* * * * *

UNITED STATES PATENT AND TRADEMARK OFFICE
CERTIFICATE OF CORRECTION

PATENT NO. : 8,552,995 B2  Page 1 of 1
APPLICATION NO. : 12/604258
DATED : October 8, 2013
INVENTOR(S) : Harald Philipp et al.

It is certified that error appears in the above-identified patent and that said Letters Patent is hereby corrected as shown below:

In the Claims

Col. 14, Ln. 25: After "of" and before "inputs" delete "analogy" and insert --analog--.

Signed and Sealed this
Fourteenth Day of October, 2014

Michelle K. Lee
*Deputy Director of the United States Patent and Trademark Office*

UNITED STATES PATENT AND TRADEMARK OFFICE
CERTIFICATE OF CORRECTION

PATENT NO.        : 8,552,995 B2                                     Page 1 of 1
APPLICATION NO.   : 12/604258
DATED             : October 8, 2013
INVENTOR(S)       : Harald Philipp et al.

It is certified that error appears in the above-identified patent and that said Letters Patent is hereby corrected as shown below:

In the Claims

Column 15, line 19, in claim 17: After "claim" and before "wherein" delete "13," and insert --10,--.

This certificate supersedes the Certificate of Correction issued October 14, 2014.

Signed and Sealed this
Twenty-fourth Day of March, 2015

Michelle K. Lee
*Director of the United States Patent and Trademark Office*